(12) United States Patent
Mizushima

(10) Patent No.: US 7,571,277 B2
(45) Date of Patent: Aug. 4, 2009

(54) SEMICONDUCTOR MEMORY SYSTEM FOR FLASH MEMORY

(75) Inventor: Nagamasa Mizushima, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 403 days.

(21) Appl. No.: 11/616,932

(22) Filed: Dec. 28, 2006

(65) Prior Publication Data

US 2008/0126678 A1    May 29, 2008

(30) Foreign Application Priority Data

Nov. 6, 2006    (JP)    ............................. 2006-300338

(51) Int. Cl.
*G06F 12/00*    (2006.01)
(52) U.S. Cl. ........................ 711/103; 711/156; 711/170; 365/185.29; 365/185.33; 365/218; 713/1; 713/100
(58) Field of Classification Search ................. 711/103, 711/156, 170; 365/185.29, 185.33, 218; 713/1, 100
See application file for complete search history.

(56) References Cited

U.S. PATENT DOCUMENTS

| | | | | |
|---|---|---|---|---|
| 5,546,348 A | | 8/1996 | Honma et al. | 365/230.03 |
| 5,568,423 A | * | 10/1996 | Jou et al. | 365/185.33 |
| 5,819,307 A | * | 10/1998 | Iwamoto et al. | 711/103 |
| 5,963,474 A | | 10/1999 | Uno et al. | 365/185.04 |
| 7,391,654 B2 | * | 6/2008 | Aritome | 365/185.29 |
| 2003/0135793 A1 | | 7/2003 | Craig et al. | 714/42 |

FOREIGN PATENT DOCUMENTS

| | | |
|---|---|---|
| JP | 05-216775 | 8/1993 |
| JP | 2000-181805 | 6/2000 |

* cited by examiner

*Primary Examiner*—Stephen C Elmore
(74) *Attorney, Agent, or Firm*—Brundidge & Stanger, P.C.

(57) ABSTRACT

Provided is a semiconductor memory system including a plurality of main memory chips and sub-memory chips as alternatives, in which each main memory chip includes a plurality of reserved memory blocks in the same chip as alternatives to an abnormal memory block. When it is detected that the number of the remaining reserved memory blocks unused as blocks to be reassigned has reached a first predetermined value in the main memory chip, the memory blocks in the sub-memory chip starts to be formatted. When the number of the remaining reserved memory blocks unused in the main memory chip reaches a second predetermined value, read/write with respect to the main memory chip is switched to the sub-memory chip, while bypassing the format process for the memory block in the sub-memory chip. Thus, in the semiconductor memory system including a main flash memory, an alternative flash memory, and a write cache memory, the capacity of a RAM for the write cache memory can be reduced.

10 Claims, 9 Drawing Sheets

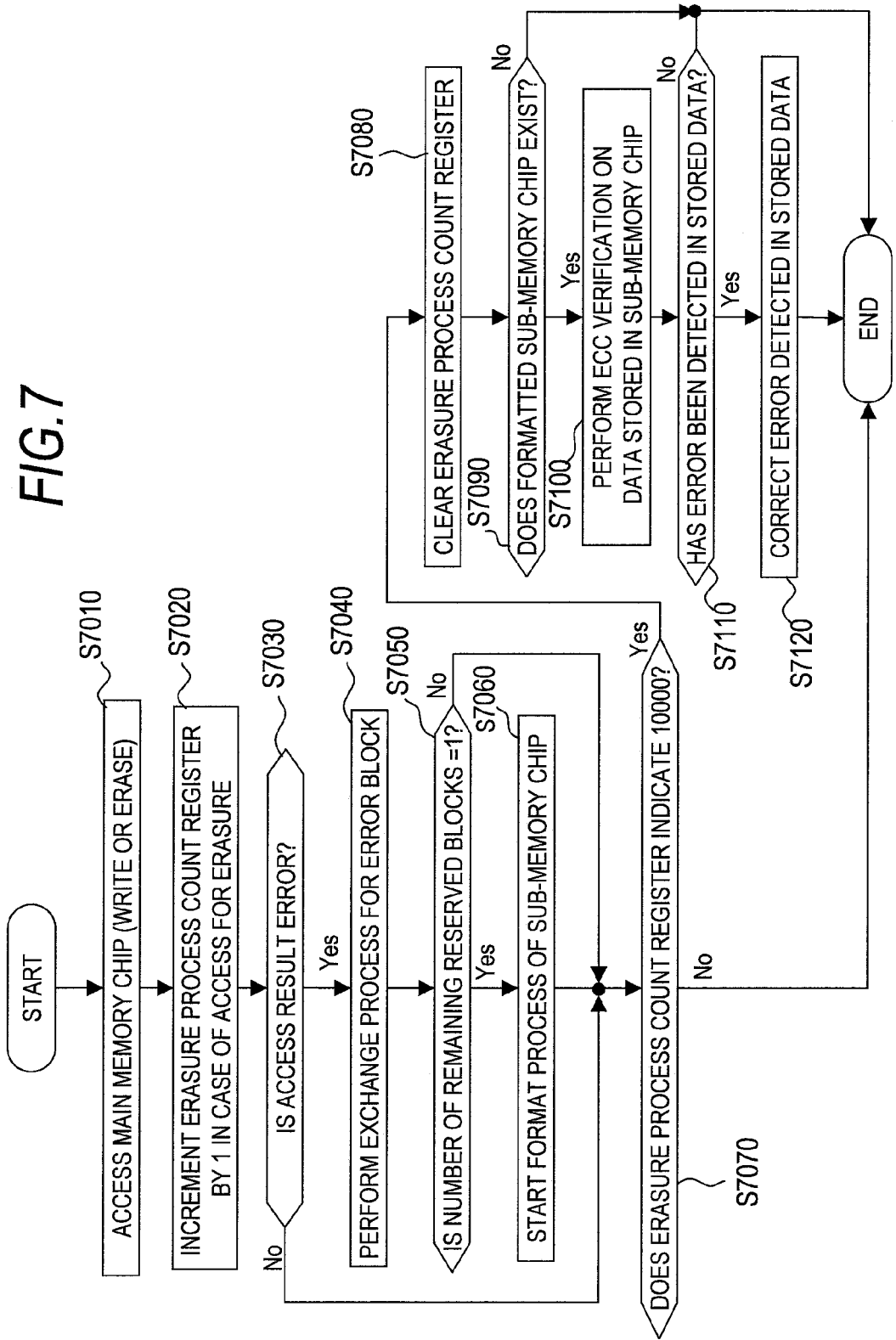

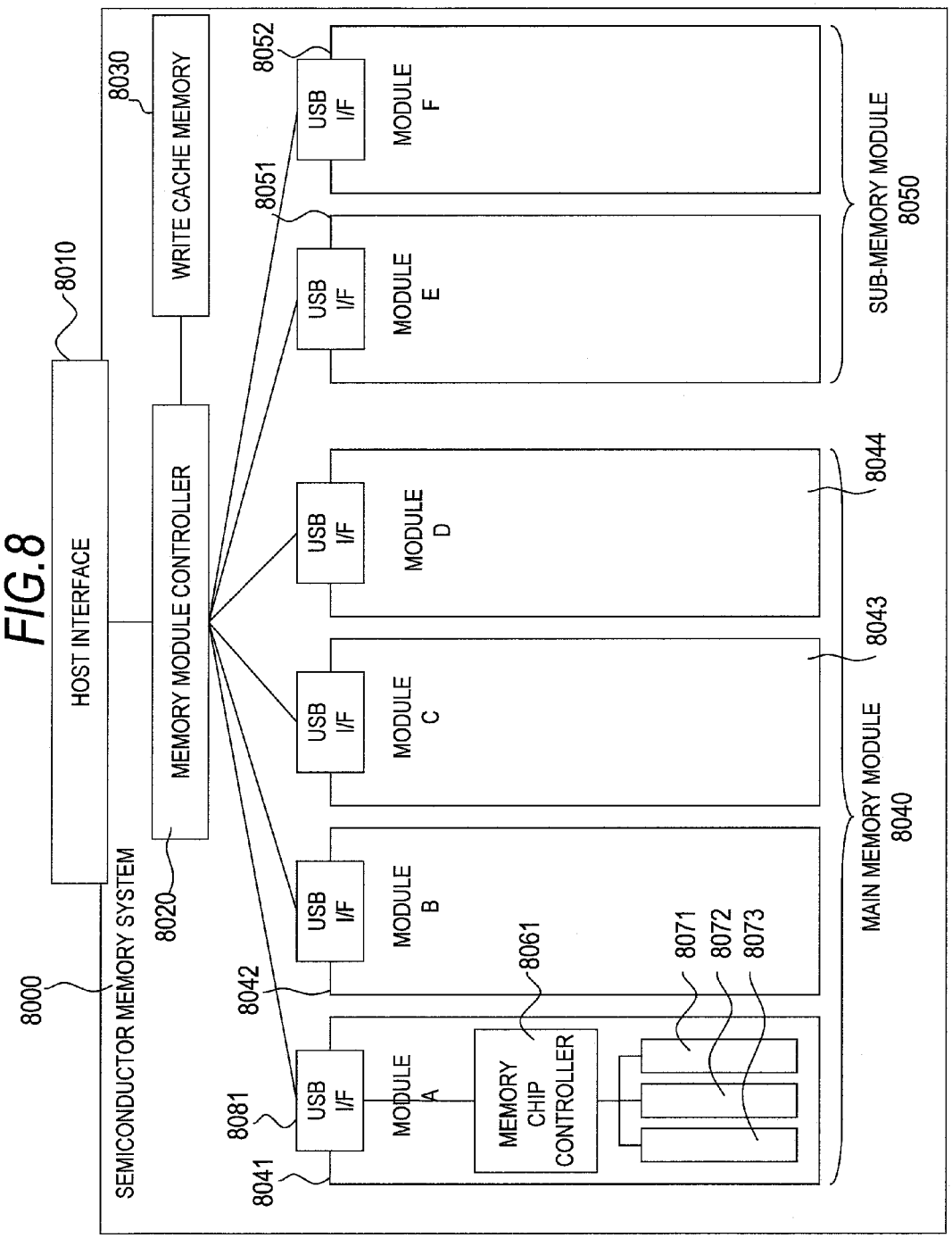

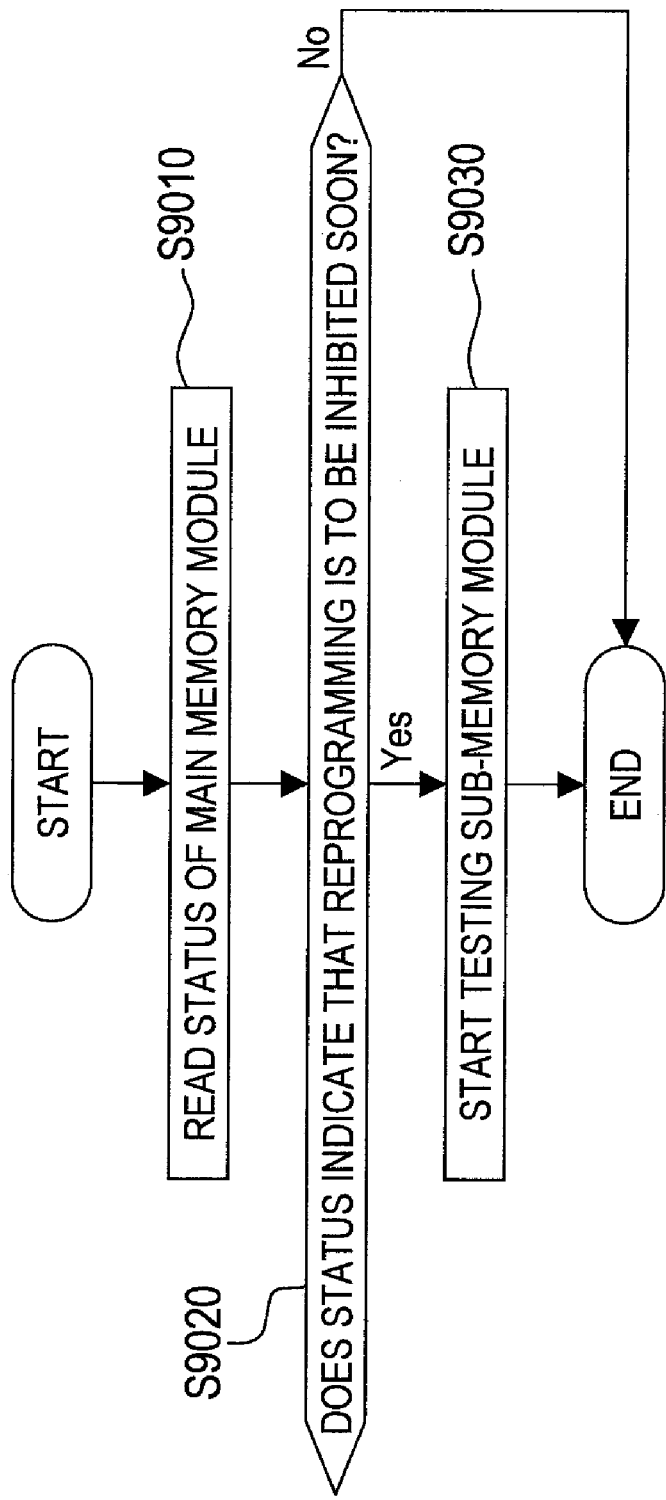

SEMICONDUCTOR MEMORY SYSTEM FOR FLASH MEMORY

CLAIM OF PRIORITY

The present application claims priority from Japanese application P2006-300338 filed on Nov. 6, 2006, the content of which is hereby incorporated by reference into this application.

BACKGROUND

This invention relates to a semiconductor memory system using a non-volatile memory capable of being electrically reprogrammed, and more specifically, to a control method for an alternative memory in a case of a failure or degradation of a memory by using a flash memory as a non-volatile memory.

In general, a flash memory is a semiconductor memory including at most several percent of originally abnormal memory blocks which cannot be reprogrammed. It is necessary to handle the memory so as not to use the abnormal memory blocks. Therefore, before using the memory for reading/writing data, a format process is required. Specifically, in the format process, characteristic data which indicates whether the memory block is normal or abnormal is read from a specific address in the block. When the memory block is normal block which can be used, management information indicating that the memory block is normal is written in the block. Further, when the memory block is reprogrammed 100000 times or more, the flash memory may change into an abnormal memory afterwards due to degradation. As a result, the reprogramming for the block becomes impossible (but it is possible to read from the block). In this case, in order to preserve the semiconductor memory system, reassignment for the block is performed. Specifically, data stored in the abnormal block is moved to a normal block and a logical address is reassigned. It should be noted that the normal block to be reassigned may be included in the same memory chip or another memory chip.

JP 05-216775 A discloses a semiconductor memory system including a main flash memory, an alternative flash memory, and a write cache memory mounted thereon. When a block which has reached the end of its life or in which a failure has occurred is detected, a storage destination is switched from the abnormal block to a block in the alternative flash memory. The write cache memory is a RAM which functions as a write data cache for improving a write latency in the semiconductor memory system. JP 2000-181805 A discloses a memory system including a flash memory, a processor, and a display lamp. The processor includes means for controlling the display lamp when the remaining capacity of a reserved storage area reaches a set capacity, and notifying an operator etc. performing maintenance of a fact that the reprogramming for the flash memory may become impossible in the near future.

SUMMARY

For the semiconductor memory system disclosed in JP 05-216775 A, it is necessary to perform a format process for a block in an alternative flash memory when a storage destination is switched from an abnormal block in the main flash memory to a block in the alternative flash memory. During the format process, when a host frequently sends a write request to a logical address assigned to the abnormal block, the alternative flash memory is not yet in a state which allows writing therein, so all the write data must be stored in the write cache memory. There is a problem in that a RAM having a large capacity has to be mounted as the write cache memory in order to deal with the above.

In a case of a semiconductor memory system which does not include the write cache memory, a block in an alternative flash memory is formatted when the read/write to an abnormal block in the main flash memory is switched to the block in the alternative flash memory. At this time, there is a problem in that the read/write cannot be performed on the semiconductor memory system until the format process is completed.

This invention has been made in view of the above-mentioned circumstances, and therefore, it is an object of this invention to realize prompt switching of an abnormal main flash memory to an alternative flash memory and to suppress an increase in capacity of a RAM in a case of using a write cache memory.

According to an aspect of this invention, there is provided a semiconductor memory system including a plurality of main memory chips (first memory chips) and a plurality of alternative sub-memory chips (second memory chips). In the semiconductor memory system, each of the main memory chips includes a plurality of reserved memory blocks as alternatives to an abnormal memory block in the same chip. In one of the main memory chips, a format (initialization) process for a memory block in one of the sub-memory chips is started, when it is detected that the number of the remaining reserved memory blocks unused as alternatives has reached a first predetermined value (e.g., 1). The format process is completed before the number of the remaining reserved memory blocks unused in the main memory chip reaches a second predetermined value (e.g., 0).

Further, in the semiconductor memory system of this invention, data in the sub-memory chip is periodically verified according to the progression speed of degradation of the main memory chip during a time period between when the format process for the sub-memory chip is completed and when switching is started.

Further, the semiconductor memory system includes a cache memory for temporarily storing data to be written therein.

According to this invention, the format process for the block in the sub-memory chip can be bypassed when the data write is switched from the main memory chip to the sub-memory chip, which can reduce a time required for the format process. Further, in the case of including the write cache memory, the write data amount stored in the write cache memory until the recording of data stored in the main memory chip is switched to the sub-memory chip is reduced. Accordingly, the capacity of the RAM for the write cache to be mounted on the semiconductor memory system can be reduced, which can produce an effect of reducing the manufacturing cost.

Further, according to this invention, in a case where a long waiting time is required until the formatted sub-memory chip starts to be used, fatal data corruption due to a retention (charge retention) failure is prevented, which can produce an effect of enhancing the reliability.

BRIEF DESCRIPTION OF THE DRAWINGS

FIG. 7 is a flowchart showing a procedure until a format process for the sub-memory chip or an ECC verification process is started according to the second embodiment.

FIG. 8 is a block diagram showing a semiconductor memory system according to a third embodiment.

FIG. 9 is a flowchart showing a procedure until a test for a sub-memory module is started according to the third embodiment.

DETAILED DESCRIPTION OF THE PREFERRED EMBODIMENTS

Embodiments of this invention will be described below with reference to the drawings.

First Embodiment

Hereinafter, a description is made of a first embodiment according to this invention.

Figure 1:
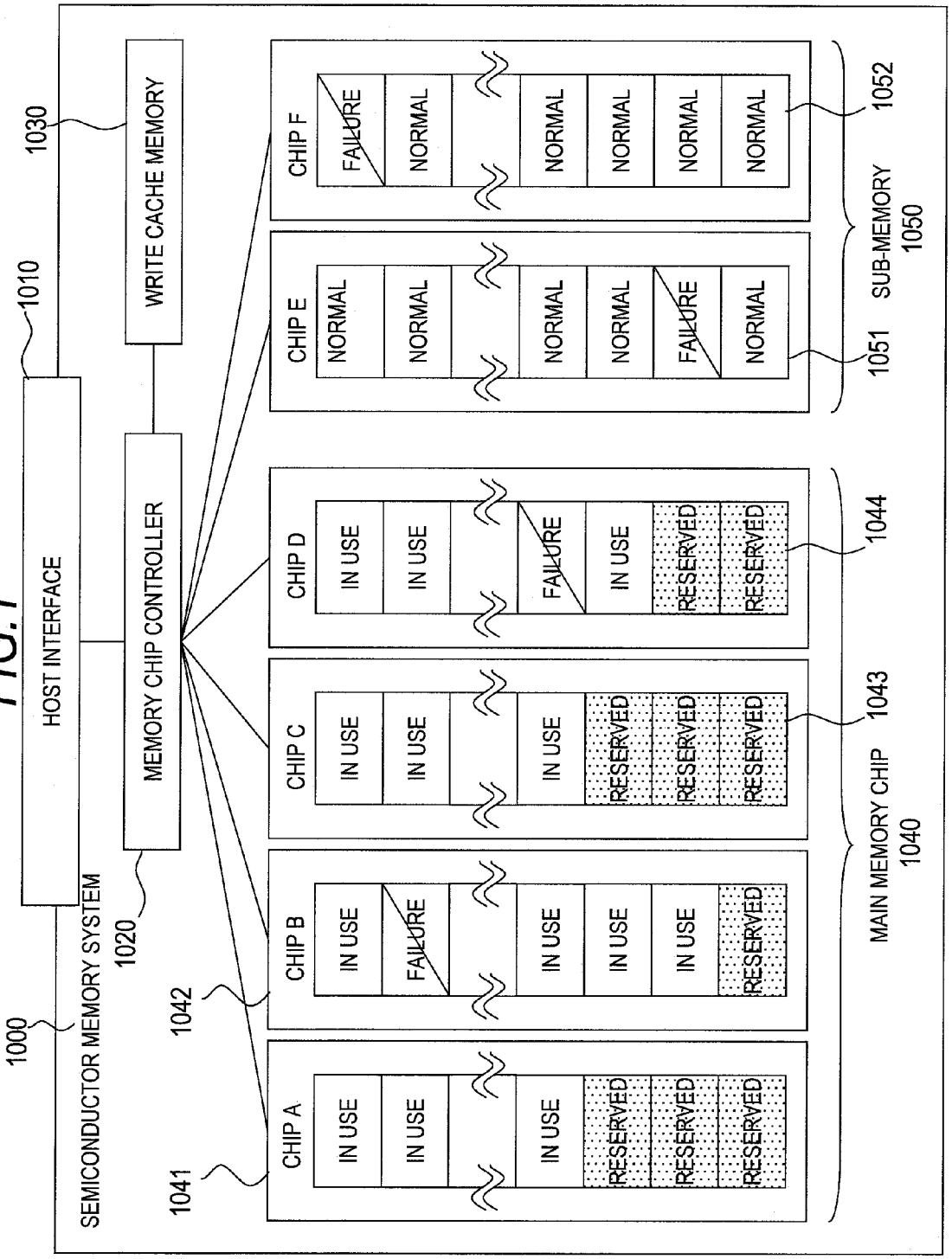
FIG. 1 is a block diagram showing a semiconductor memory system according to a first embodiment of this invention.

FIG. 1 is a block diagram roughly showing an internal structure of a semiconductor memory system 1000 according to the first embodiment. The semiconductor memory system 1000 includes a host interface 1010, a memory chip controller 1020, a write cache memory 1030, a main memory chip 1040, and a sub-memory chip 1050.

The host interface 1010 serves as an interface connected to an external host. The host interface 1010 sends stored read data to the host and receives write data to be stored from the host in response to a read/write request command from the host. The host designates a storage position of data requested to be read/written based on a logical address. The logical address is a virtual address, which is different from a physical address used in directly accessing the main memory chip 1040 and the sub-memory chip 1050.

A structure of the host interface 1010 and a protocol for transmission/reception of a command or data preferably conform to an interface specification (such as parallel ATA, serial ATA, or SCSI) which provides compatibility with a standard hard disk drive.

The write cache memory 1030 is a volatile memory mainly constituted of a RAM, and is used for temporarily storing data as a cache memory. Write data received in response to a write request from the host is temporarily stored in the write cache memory 1030. At this time, completion of the data write is reported to the host. During a time period for which there is no access from the host, the data is written (destaged) in a predetermined position in a predetermined memory chip of the main memory chip 1040 (or sub-memory chip 1050) so as not to cause the write cache memory 1030 to overflow. Further, when read data to be sent in response to a read request from the host is contained in the write cache memory 1030, the data is read from the write cache memory 1030 instead of reading from the predetermined position in the memory chip.

The memory chip controller 1020 serves as a microprocessor for controlling the host interface 1010, the write cache memory 1030, the main memory chip 1040, and the sub-memory chip 1050 which are connected thereto. The memory chip controller 1020 performs interpretation of the read/write request from the host, transmission/reception of data to/from the host, access to the write cache memory 1030 (read/write), and access to each flash memory chip (read/write/erasure), as described above. In addition, the memory chip controller 1020 manages which storage position of which flash memory chip the logical address designated by the host corresponds to by using an address conversion table. The memory chip controller 1020 includes a volatile memory such as a RAM mounted thereon and creates, at power-on of the semiconductor memory system 1000, the address conversion table in a part of the memory (how to create the address conversion table will be described later). Further, the memory chip controller 1020 performs calculation and verification of an error correction code (ECC) for assuring data stored in each flash memory chip.

The main memory chip 1040 is a memory chip group composed of a plurality of flash memory chips (for example, four chips of chip A 1041, chip B 1042, chip C 1043, and chip D 1044). The sub-memory chip 1050 is a memory chip group composed of a plurality of flash memory chips (for example, two chips of chip E 1051 and chip F 1052).

Each of the memory chips A to F is a non-volatile semiconductor memory which is written by the memory chip controller 1020 on a page basis and erased on a memory block basis. The memory block is composed of a plurality of (e.g., 128) pages. Each of the memory chips A to F includes a plurality of (e.g., 4096) memory blocks. In general, a flash memory originally includes several percent of defective memory blocks at the maximum.

Figure 3:
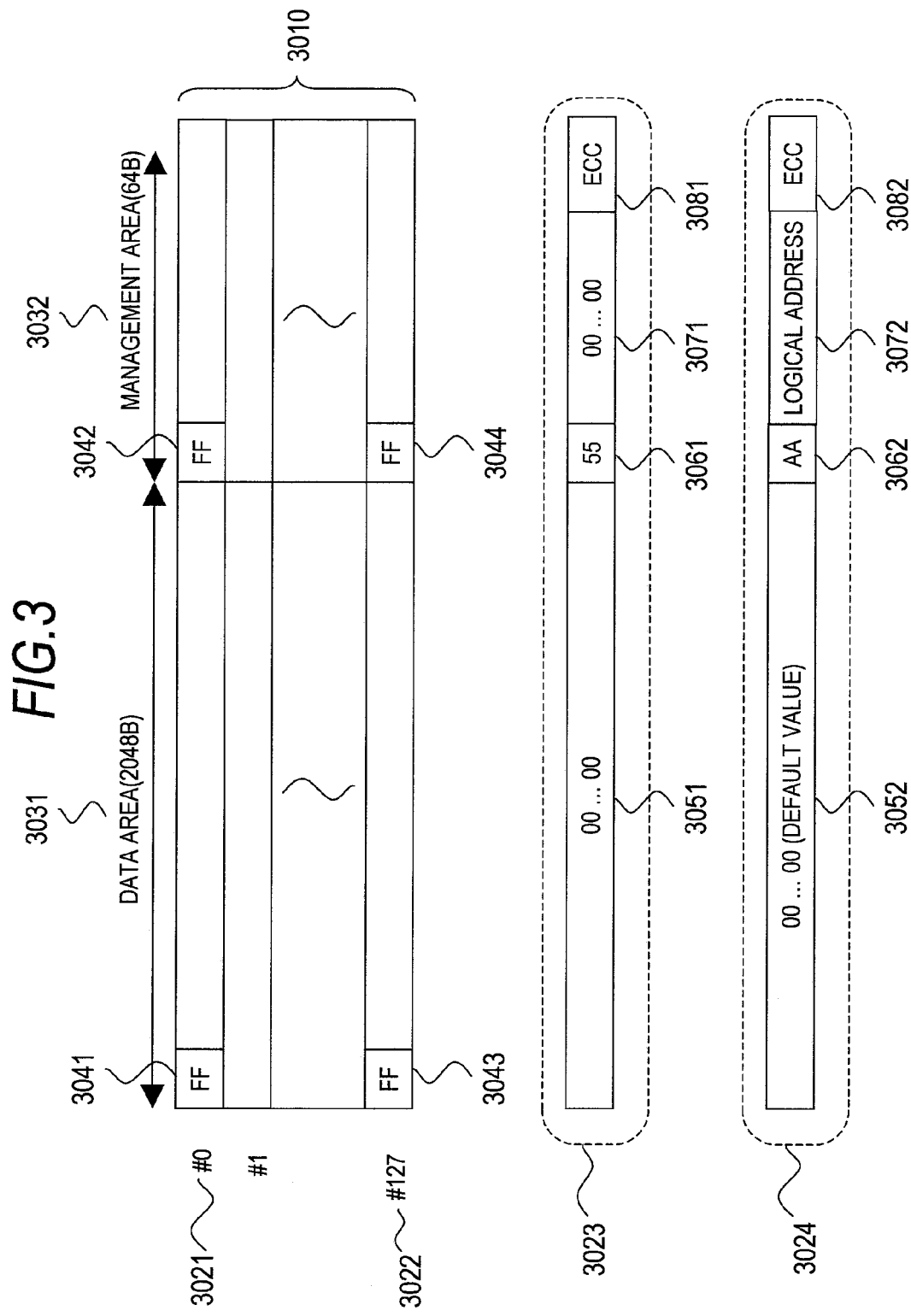
FIG. 3 is a diagram showing an internal structure of the memory block.

FIG. 3 shows a memory block 3010, and an internal structure of each memory block in the memory chip. The memory block 3010 is composed of 128 pages. Each page includes a data area 3031 of 2048 bytes in the head and a management area 3032 of 64 bytes in the last. The data area 3031 is an area for mainly storing data received from the host. The management area 3032 is an area for mainly storing information related to management of the page. In the memory chip which is unused (in a state at the time of shipment), the contents of all pages which constitute a normal memory block are full of "FF" byte. Memory blocks other than the above are originally abnormal.

In each memory chip which constitutes the main memory chip 1040, a plurality of memory blocks each of which includes a page to which a logical address is assigned in manufacturing the semiconductor memory system 1000 are included. In FIG. 1, to each memory block having a page to which a logical address is assigned, a representation of "in use" is attached. For those memory blocks, memory blocks which are not originally abnormal (i.e., normal) are adapted. As long as the memory block in use normally allows read/write access, write data received from the host is stored in one of the memory blocks and read data sent to the host is read from one of the memory blocks. Further, each memory chip constituting the main memory chip 1040 also includes a plurality of normal memory blocks each of which has a page to which a logical address is not assigned. In FIG. 1, to each of the memory blocks, a representation of "reserved" is attached. Each reserved memory block is used for an alternative block when the memory block in use changes to an abnormal block. When the semiconductor memory system 1000 operates for a long time, an erasure process and a write process are performed many times on the memory blocks in use. The memory blocks in use degrade to become abnormal (unable to be reprogrammed). Thus, each time the abnormal block is generated, the reserved memory block is consumed little by little.

Figure 2:
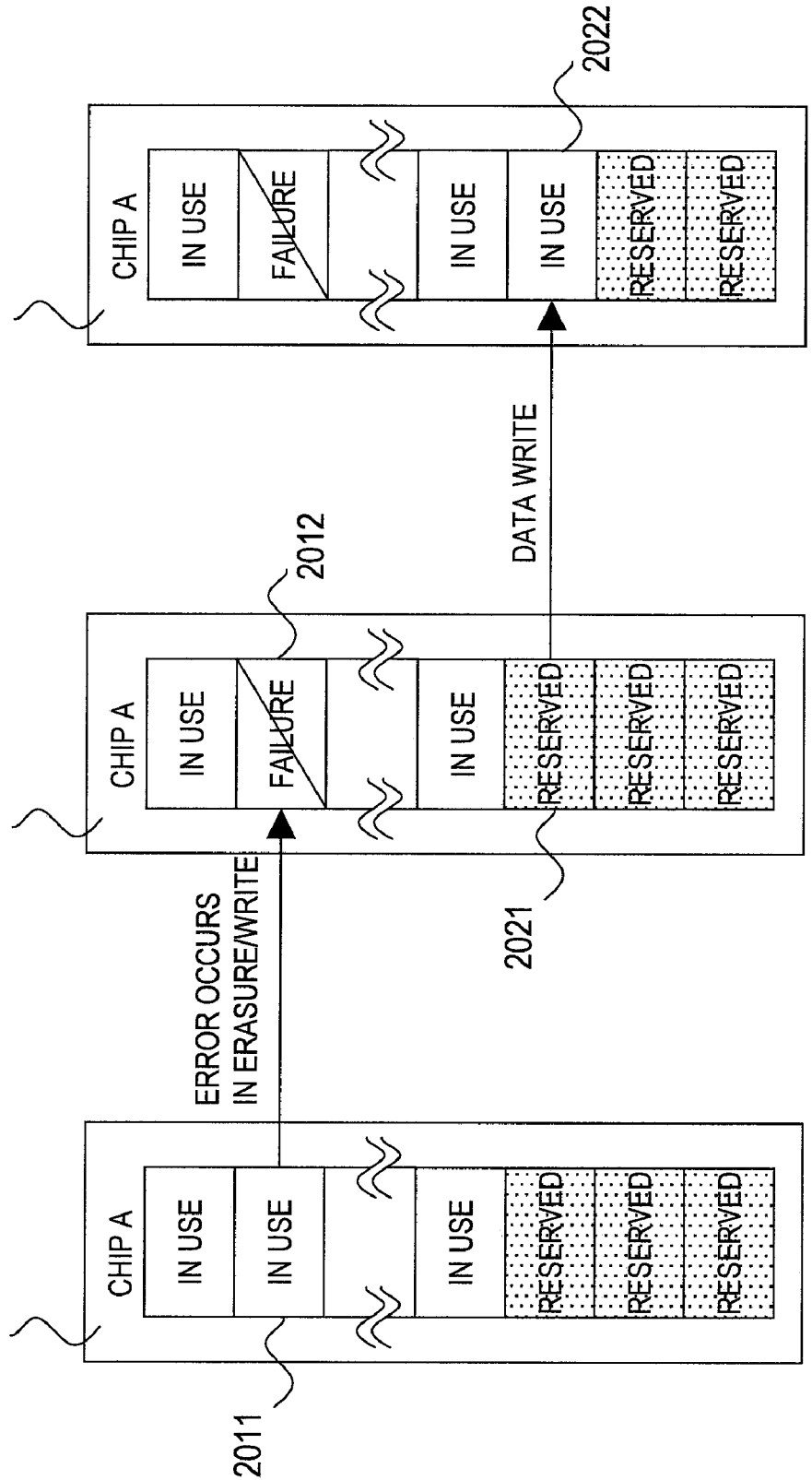
FIG. 2 is a diagram showing a reassignment process for a memory block which is abnormal.

FIG. 2 is a diagram showing a reassignment process of the memory block which is abnormal. When a logical address X designated in the write request from the host is assigned to a page in a memory block 2011 in use, the memory chip controller 1020 first saves the content (original data) of the block 2011 in the cache memory.

Then, the memory chip controller 1020 erases the block 2011, reprograms a part of the original data stored in the write cache memory 1030 with received write data, and writes the write data into the erased block 2011. At this time, when an error occurs in the block, the block becomes an abnormal memory block 2012. The memory chip controller 1020 assigns the logical address X to a predetermined page in a reserved memory block 2021, and writes in the reserved memory block 1021 the write data which cannot be written due to the error. Then, the memory block to which the write data is written serves as a memory block in use 2022. As a result of the reassignment process described above, the number of remaining reserved memory blocks of the chip A 1041 is reduced from 3 to 2.

The memory blocks in the memory chip constituting the sub-memory chip 1050 are not used at all in manufacturing the semiconductor memory system 1000. A logical address is not assigned to any one of pages in the blocks. In the sub-chip memory 1050, most of the unused memory blocks are normal, but originally abnormal blocks are also included. In FIG. 1, those memory blocks are respectively given a representation of "normal" or "abnormal". When the semiconductor memory system 1000 operates for a long time, and the reserved memory blocks in one of the memory chips (e.g., chip B 1042) in the main memory chip 1040 are exhausted (the number of the remaining reserved memory blocks becomes 0), the write data to the logical address which is assigned to the page in the chip B 1042 is stored in a memory block in one (e.g., chip E 1051) of the memory chips in the sub-memory chip 1050 from then on. Naturally, a normal memory block is used as the new memory block.

In order to store data in the memory block in the unused memory chip (e.g., chip E 1051) in the sub-memory chip 1050 as an alternative memory block in the main memory chip 1040, the memory chip controller 1020 needs to perform a format (initialization) process for the unused chip E 1051 in advance. Hereinafter, contents of the format process for the unused chip is described.

First, the memory chip controller 1020 judges whether each memory block 3010 constituting the chip E 1051 is normal or abnormal. The judgment is made based on the following criterion recommended by a vendor.
(1) In a head page 3021 shown in FIG. 3, a head byte 3041 of the data area 3031 or a head byte 3042 of the management area 3032 has a value of "FF".
(2) In a last page 3022 shown in FIG. 3, a head byte 3043 of the data area 3031 or a head byte 3044 of the management area 3032 has a value of "FF". When the conditions (1) and (2) both are satisfied, the memory block is judged to be normal. Otherwise, the memory block is judged to be originally abnormal.

Second, the memory chip controller 1020 manages a plurality of memory blocks judged to be normal as the "reserved" blocks. In FIG. 3, a page 3023 shows a structure of each page constituting the reserved blocks of the sub-memory chip 1050. For each page 3023, the memory chip controller 1020 writes "0" as a default value in the data area 3051, the value "55" meaning "reserved" in the head byte 3061 in the management area, and the value "0" in a subsequent area 3071. Then, the memory chip controller 1020 calculates an ECC with respect to the entire page and writes the obtained ECC in a last area 3081 of 8 bytes.

As described above, the unused chip format process is performed. It should be noted that the unused chip is preferably formatted immediately before starting to use the chip as compared to a case of formatting the chip at the time of manufacturing the semiconductor memory system 1000. This is because when a long time (e.g., 10 years) elapses since the respective chips of the sub-memory chip 1050 are formatted until the chips are used as alternatives, there is a possibility that data stored in those chips may cause fatal corruption of data due to retention failure or the like of the flash memory cell, which results in deterioration of the reliability.

According to this invention, the memory chip controller 1020 formats the unused chip when almost all the reserved memory blocks in the chip B 1042 are used (for example, when the remaining count thereof is 1). Accordingly, a process amount for switching a storage destination of the write data from the host from the chip B 1042 to the chip E 1051 is reduced as compared to the conventional case.

During the switching process, the write data on the write cache memory 1030 cannot be destaged, so the write data received from the host during the period is stored in the write cache memory 1030. According to this invention, a write data amount stored in the write cache memory 1030 during the switching process is reduced. Therefore, there exhibits an effect that the capacity of a RAM to be mounted on the semiconductor memory system 1000 for the write cache memory 1030 can be reduced.

Figure 4:
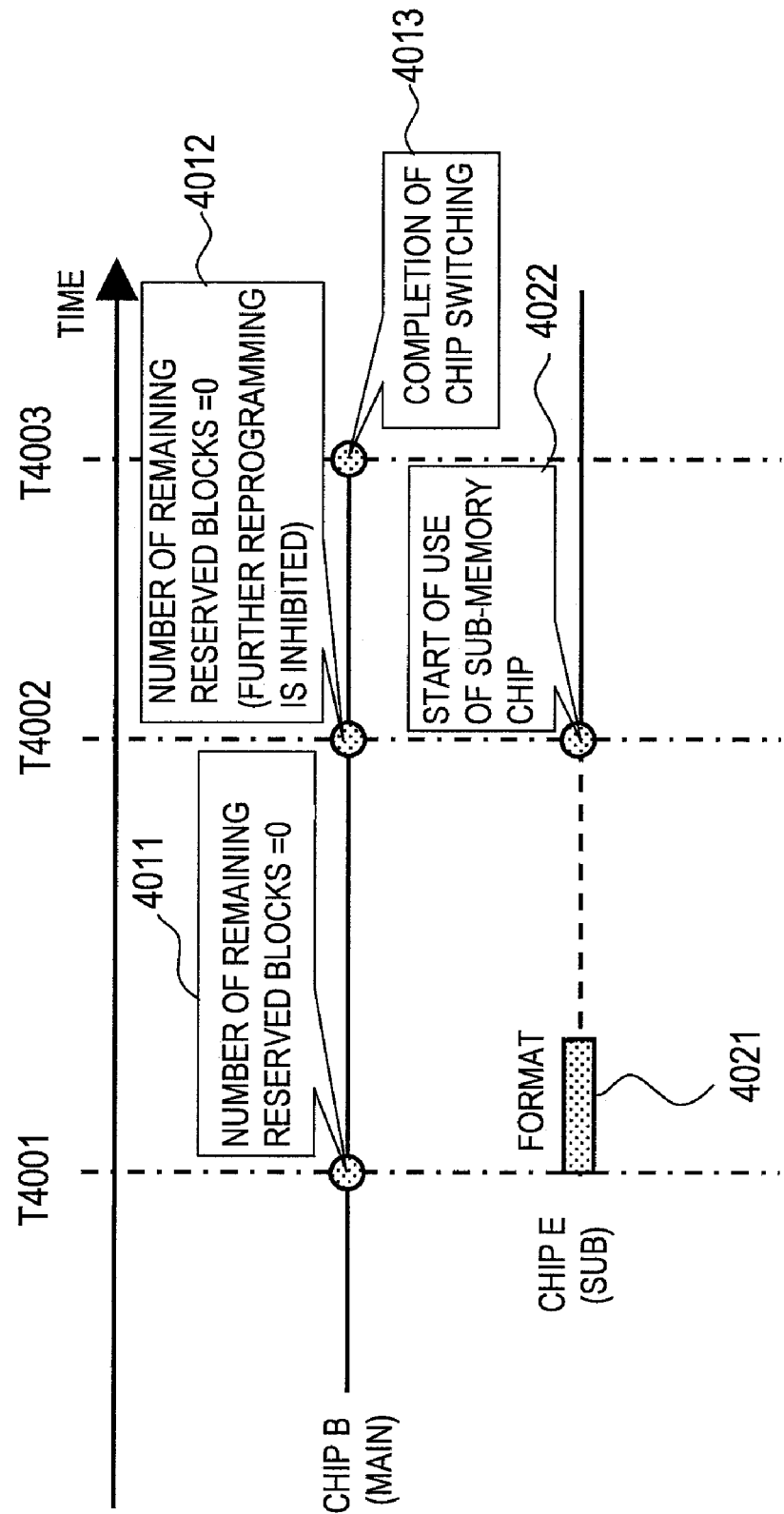
FIG. 4 is a timing chart showing a switching process from a main memory chip to a sub-memory chip according to the first embodiment.

FIG. 4 is a timing chart showing the procedure of the switching process from the chip B 1042 to the chip E 1051 according to the first embodiment. In FIG. 4, the abscissa indicates time, the solid line indicates a time period (time period for which the chip B 1042 and the chip E 1051 are write targets) for which the chip B 1042 and the chip E 1051 operate, and the dashed line indicates a time period for which the chip E 1051 is in a standby state.

First, at a time T4001, an event 4011 in which the number of the remaining reserved memory blocks in the chip B 1042 reaches a first predetermined value (e.g., 1) occurs. The memory chip controller 1020 monitors the number of the remaining reserved memory blocks, and starts the above-mentioned format process for the chip E 1051 in response to the fact that the number of the remaining reserved memory blocks reaches the first predetermined value. In order to prevent the performance degradation of the semiconductor memory system 1000, the format process is preferably performed little by little when there is no access from the host after the time T4001. For example, the memory chip controller 1020 starts the format process for a predetermined memory block in the sub-memory chip 1050 when there is no access from the host. When there is access from the host, the format process is temporarily stopped. When the access is completed, the format process is resumed. Thus, the format process can be intermittently performed.

Next, at a time T4002, an event 4012 (in which the memory chip controller 1020 detects the number of remaining reserved memory blocks of 0) in which the number of the remaining reserved memory blocks in the chip B 1042 reaches a second predetermined value (e.g., 0) occurs. The memory chip controller 1020 monitors the number of the remaining reserved memory blocks, and starts using the chip E 1051 in response to the fact that the number of the remaining reserved memory blocks reaches the second predetermined value (4022). After the time T4002, the memory chip controller 1020 sets the memory blocks in the chip B 1042 as read-only and inhibits reprogramming thereof.

After the time T4002, when receiving a read request from the host with respect to the logical address X assigned to the page in the chip B 1042, the memory chip controller 1020 reads data from a corresponding page in the chip B 1042. When receiving a write request from the host with respect to the logical address X, the memory chip controller 1020 reprograms page address information corresponding to the logical address X in the address conversion table and changes the address conversion table so as to indicate a page included in the reserved memory block in the chip E 1051. Then, the memory chip controller 1020 writes data in the corresponding page in the chip E 1051 which is a new data storage position corresponding to the logical address X. At this time, a data structure of the page of the chip E 1051 in the sub-memory chip 1050 is represented by a page 3024 shown in FIG. 3.

In other words, write data received from the host is written in a data area 3052, a value "AA" meaning "in use" is written in a head byte 3062 in a management area, and the logical address X assigned to the page is written in a subsequent area 3072. Then, the ECC with respect to the entire page 3024 is calculated, and the calculated ECC is written in a last area 3082 of 8 bytes in the page 3024. For the subsequent read/write request with respect to the logical address X from the host, the memory chip controller 1020 accesses the page corresponding to the logical address X in the chip E 1051.

Through the processes as described above, the switching process from the chip B 1042 to the chip E 1051 is gradually performed. Then, the read/write request from the host with respect to all the logical addresses assigned to the pages in the chip B 1042 is executed through the read/write access to only the chip E 1051, and the chip switching is completed (4013) at a time T4003.

As shown in the page 3024 of FIG. 3, in each page of the memory blocks in use in the semiconductor memory system 1000, a logical address corresponding thereto is described. At power-on of the semiconductor memory system 1000, the memory chip controller 1020 reads out the logical addresses described in those pages and creates the above-mentioned address conversion table on the RAM on the basis of the information.

Figure 5:
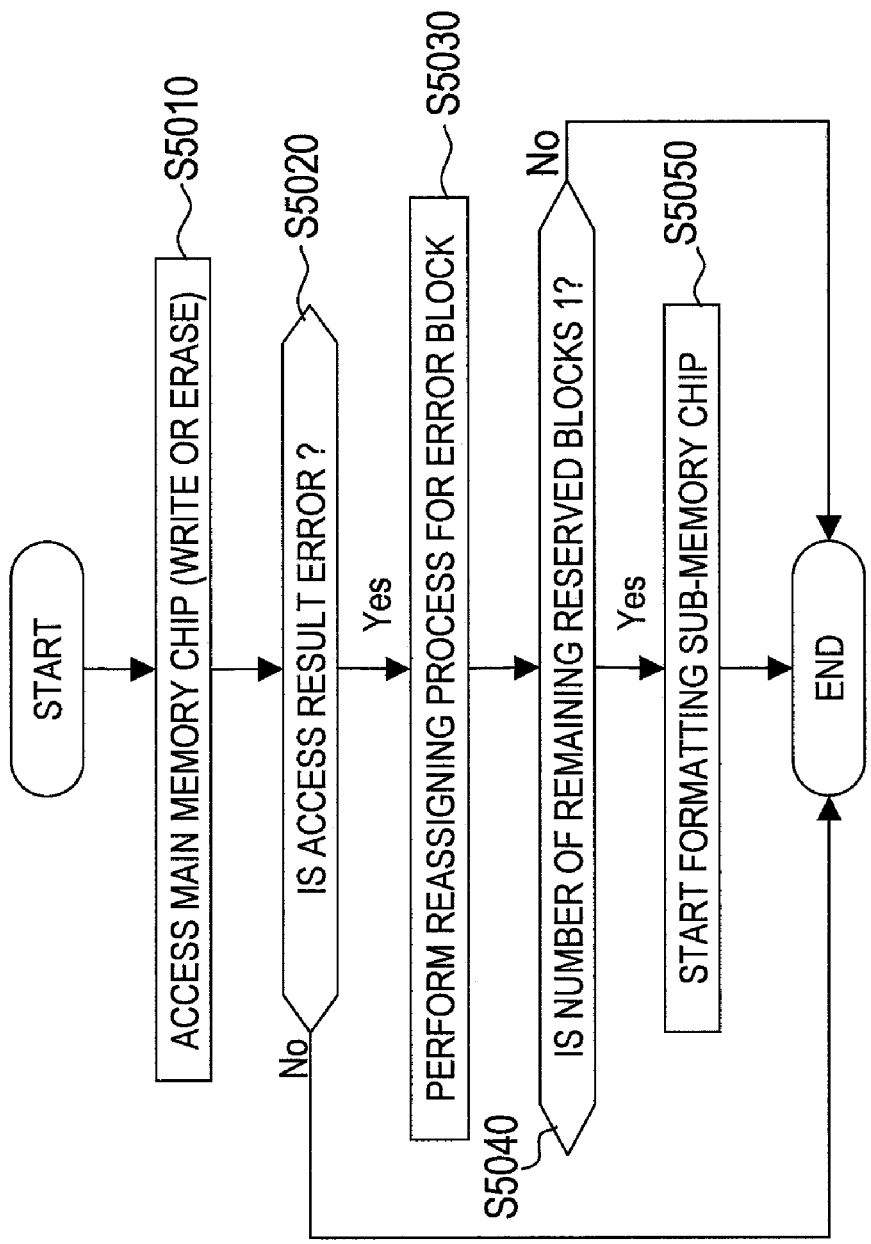
FIG. 5 is a flowchart showing a procedure until a format process for the sub-memory chip is started according to the first embodiment.

FIG. 5 is a flowchart showing an example of a process which is performed by the memory chip controller 1020 until the format process for the chip E 1051. First, the host performs write access to the semiconductor memory system 1000, which causes the memory chip controller 1020 to perform access for write or erasure with respect to the chip B 1042 of the main memory chip 1040 (S5010). When the access result for the write or erasure to the chip B 1042 is an error (S5020), the memory chip controller 1020 performs a reassignment process from a block in which the error has occurred to the reserved memory block in the chip B 1042 (S5030). When the reassignment process to the reserved memory block is completed, the number of the remaining reserved memory blocks is reduced by 1 in the chip B 1042. Next, the memory chip controller 1020 checks the number of the remaining reserved memory blocks in the chip B 1042. When the number thereof is 1 (S5040), the format process is started for the chip E 1051 in the sub-memory chip 1050 (S5050).

In this case, a first predetermined value (remaining count of 1) depending on which the memory chip controller 1020 starts the initialization of a predetermined chip E 1051 in the sub-memory chip 1050 may be determined based on a time period (formatting speed) required by the memory chip controller 1020 for formatting the chip E 1051 and a time period (progression speed of degradation) for which the number of the reserved memory blocks of the chip B 1042 in the main memory chip 1040 reaches a second predetermined value (remaining count of 0). For example, when the reduction speed of the number of the reserved memory blocks in a unit time, namely, the progression speed of degradation in a unit time is high, the first predetermined value is set to a large value, e.g., 2, thereby making it possible to switch the write destination to the chip E 1051 after reliably completing the initialization for the sub-memory chip 1050. Alternatively, when the host frequently performs access, the first predetermined value is set to be large. In this case, the sub-memory chip 1050 must be formatted so as not to hinder the access from the host, so it is difficult to ensure the time for executing the format process. Therefore, even when the time required for the format process is subsequently constant, the time period, during which the format process is started while the host frequently performs access and the format process is completed, is longer than the case where the host less frequently performs the access. In view of this, the first predetermined value is set to be large, thereby making it possible to reliably complete formatting the alternative chip E 1051 before the number of the reserved memory blocks becomes 0.

The memory chip controller 1020 determines whether the initialization for the predetermined chip E 1051 in the sub-memory chip 1050 is started or not based on the first predetermined value. The first predetermined value can be determined in advance based on a speed at which the reserved memory block in the main memory chip 1040 is consumed, namely, the progression speed of degradation (reduction amount in the remaining count in a unit time), and speed (or, e.g., the number of bytes formatted in a unit time) of formatting the predetermined block in the chip E 1051 in the sub-memory chip 1050. In other words, first, the speed of consuming the reserved memory blocks in the main memory chip 1040 is determined in advance through an experiment etc. Then, the time required for formatting the size (storage capacity) of the block in the predetermined chip E 1051 in the sub-memory chip 1050 is determined in advance based on formatting speed which is obtained based on operation speed of the memory chip controller 1020 and response speed of the sub-memory chip 1050. The number of the remaining reserved memory blocks in the main memory chip 1040 reaches the first predetermined value, the predetermined block in the chip E 1051 in the sub-memory chip 1050 starts to be formatted, and then the reserved memory blocks are consumed at the progression speed of degradation. At this time, the first predetermined value is set so as to complete the format process before the remaining count reaches the second predetermined value.

It should be noted that the second predetermined value functions as a value for inhibiting the writing according to the progression speed of degradation of the chips A to D in the main memory chip 1040. In other words, when the number of the remaining reserved memory blocks in the chip B 1042 reaches the second predetermined value, the memory chip controller 1020 inhibits the writing to the chip B 1042, and the logical address assigned to the chip B 1042 is switched to the chip E 1051 in the sub-memory chip 1050. The second predetermined value is 0 in the above description, as an example. However, the second predetermined value may be smaller than the first predetermined value, and may be appropriately set according to the structure of the semiconductor memory system 1000 or the contents of control of the memory chip controller 1020. For example, when the consumption speed of the reserved memory blocks is high and the memory chip controller 1020 uses a part of the reserved memory blocks for performing control, the first predetermined value may be set to "3" and the second predetermined value may be set to "1". As described above, the second predetermined value is used for a threshold according to which the writing to the chip is stopped and the writing destination is switched to the sub-memory chip 1050 as a result of the degradation of the chips A to D.

Further, the memory chip controller 1020 may detect the reduction speed (consumption amount of the reserved memory blocks in a unit time) of the reserved memory blocks in the main memory chip 1040 or the access frequency from the host to change the first predetermined value. For example, when the reduction speed of the reserved memory blocks is high or when the access frequency from the host is large, the memory chip controller 1020 may increase the first predetermined value.

As described above, when the number of the reserved memory blocks in the chips A to D in the main memory chip 1040 becomes equal to or smaller than the first predetermined value (in the above example, the number of the remaining memory blocks is equal to or smaller than 1), the memory chip controller 1020 starts initializing the predetermined chip in the sub-memory chip 1050, which is to be an alternative chip in the near future.

When the read/write destination is switched from the main memory chip 1040 to the sub-memory chip 1050, a block in the sub-memory chip 1050 which has already been initialized is used, which reduces the time required for initializing the block in the sub-memory chip 1050. Therefore, a write data amount stored in the write cache memory 1030 while switching the storage destination from the main memory chip 1040 to the sub-memory chip 1050 can be reduced. As a result, the capacity of the RAM for the write cache memory 1030 to be mounted on the semiconductor memory system 1000 can be reduced, which makes it possible to reduce the manufacturing cost.

Second Embodiment

A second embodiment of this invention will be described below.

The second embodiment is implemented by adding a verification function for data in the sub-memory chip 1050 to the structure of the first embodiment to enhance reliability of the semiconductor memory system 1000. In other words, in the second embodiment, the following process is added. Since the format process for the sub-memory chip 1050 described in the first embodiment is completed until the sub-memory chip 1050 starts to be used, by using an ECC attached to the data, periodical verification is performed as to whether or not the data stored in the formatted sub-memory chip 1050 is fatally corrupted due to a retention failure of the flash memory cell or the like. The other structures of the second embodiment are the same as those of the first embodiment.

In general, the lifetimes of the memory blocks of the flash memory significantly differ from one another. Therefore, a failure of the memory block may not occur for a long time after the most reserved memory blocks in the memory chip are consumed. In other words, a significantly long time period (e.g., 10 years) may elapse since the format process for the sub-memory chip 1050 until the start of using the sub-memory chip 1050. In this case, a retention time period for the data of the flash memory which is guaranteed by a memory vendor is 10 years. Therefore, there is a high probability that data of a part of the memory block may be corrupted at the time when the sub-memory chip 1050 starts to be used. In a case where there is the corrupted data which cannot be corrected by using the ECC, the memory block including the data cannot be used. As a result, a proportion of the abnormal memory blocks in the sub-memory chip 1050 is increased, which degrades the reliability of the semiconductor memory system 1000.

In view of the above, in the second embodiment, an index (degradation index) which indicates a progression speed of the degradation of the main memory chip 1040 is used to periodically verify the data stored in the sub-memory chip 1050. For example, the index indicates the number of erasure processes for the memory blocks in the main memory chip, and the verification is performed each time the number of the erasure processes exceeds a predetermined value (for example, 10000 times).

The memory chip controller 1020 includes a non-volatile memory which has higher reliability than a flash memory such as an EEPROM or a phase change RAM. The memory chip controller 1020 secures in the memory an area in which the number of the erasure processes for the memory blocks in each of the memory chips A to D in the main memory chip 1040 is stored as the index of the progression of degradation. Hereinafter, this is referred to as an erasure process count register. It should be noted that, as an area allocated to the erasure process count register, not only the storage area of the memory chip controller 1020 but also a part of the memory blocks in each of the memory chips A to D in the main memory chip 1040 can be adapted to the erasure process count register. Further, the erasure process count register is set for each block of the chips A to D.

In FIG. 1, the memory chip controller 1020 increments the erasure process count register by "1" each time the memory block in each of the memory chips A to D in the main memory chip 1040 is erased. Each time the incremented value reaches a third predetermined value (e.g., "10000"), the data stored in the formatted sub-memory chip 1050 is verified and the value is cleared to "0".

Figure 6:
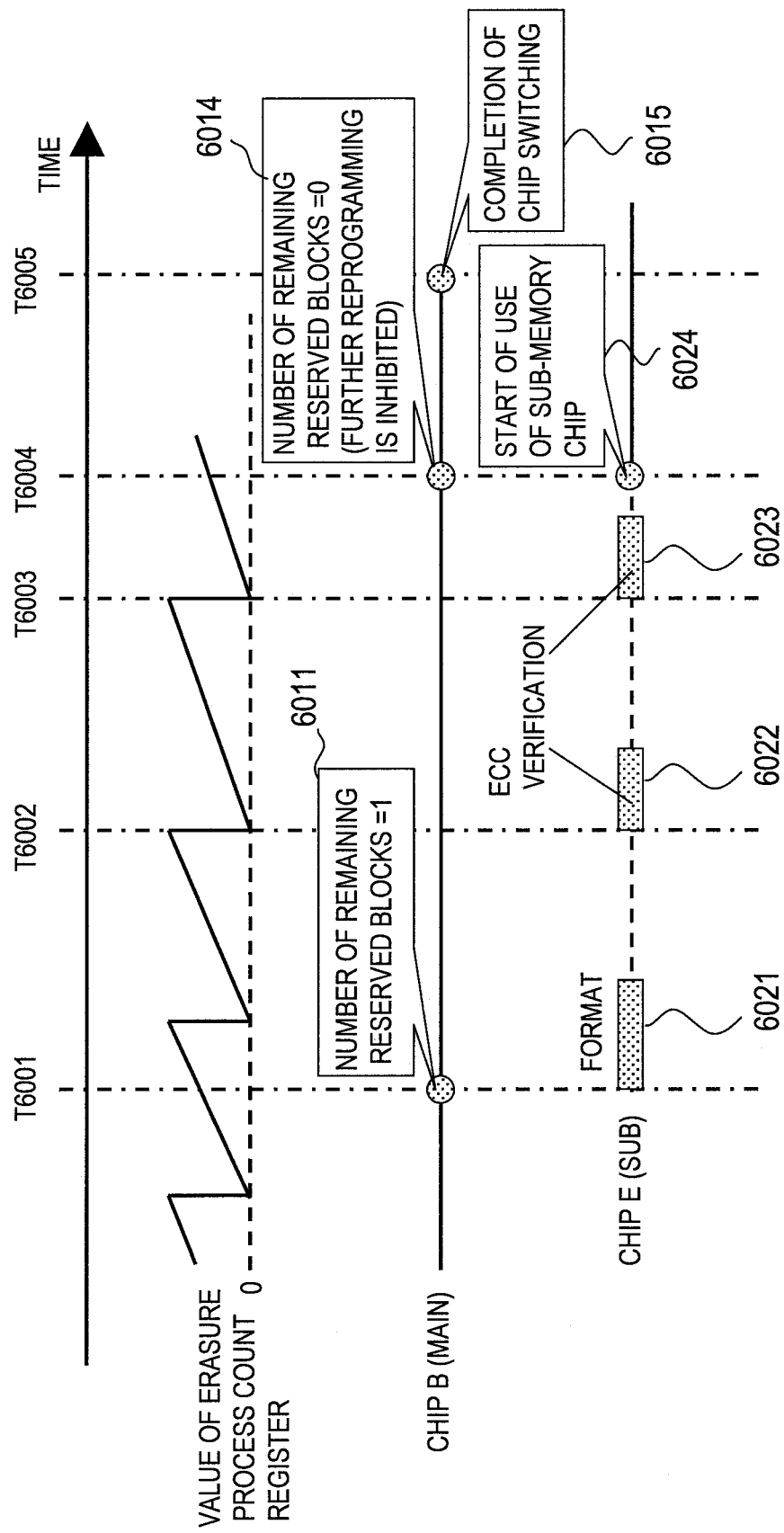
FIG. 6 is a timing chart showing a switching process from a main memory chip to a sub-memory chip according to a second embodiment of this invention.

FIG. 6 is a timing chart showing the procedure of the switching process from the chip B 1042 to the chip E 1051 according to the second embodiment. In FIG. 6, the abscissa indicates time, the solid line indicates a time period for which the chip B 1042 and the chip E 1051 operate, and the dashed line indicates a time period for which the chip E 1051 is in a standby state.

First, at a time T6001, an event 6011 in which the number of the remaining reserved memory blocks in the chip B 1042 reaches a first predetermined value (e.g., 1) occurs. The memory chip controller 1020 monitors the number of the remaining reserved memory blocks, and starts the above-mentioned format process for the chip E 1051 in response to the fact that the number of the remaining reserved memory blocks reaches the first predetermined value. The format process is preferably performed little by little when the data amount stored in the write cache memory 1030 is sufficiently small and there is no access from the host after the time T6001.

Next, at a time T6002, an event occurs in which the value of the erasure process count register of the chip B 1042 becomes "10000". The memory chip controller 1020 monitors the value of each erasure process count register, and starts the ECC verification for the stored data in the chip E 1051 in response to the fact that the value reaches the third predetermined value (e.g., 10000) (6022). The process is preferably performed little by little when there is no access from the host and when the data amount stored in the write cache memory 1030 is sufficiently small.

After resetting the erasure process count register to 0, also at a time T6003, an event occurs in which the value of the erasure process count register of the chip B 1042 reaches the third predetermined value of "10000". In response to this, the memory chip controller 1020 starts the ECC verification for the stored data in the chip E 1051 as in the time T6002 (6023).

At a time T6004, an event 6014 (in which the memory chip controller 1020 detects that the remaining count is 0) in which the number of the remaining reserved memory blocks in the chip B 1042 reaches the second predetermined value (e.g., 0) occurs. In response to this, the memory chip controller 1020 starts using the chip E 1051 (6024). After the time T6004, the memory chip controller 1020 sets the memory block in the chip B 1042 as read-only, and inhibits reprogramming thereof.

After the time T6004, when receiving from the host a read request with respect to the logical address X assigned to a page in the memory chip B 1042, the memory chip controller 1020 reads data from a corresponding page in the chip B 1042. When receiving from the host a write request with respect to the logical address X, the memory chip controller 1020 reprograms page address information corresponding to the logical address X in the address conversion table and changes the address conversion table so as to indicate the page included in the reserved memory block in the chip E 1051. Then, the memory chip controller 1020 writes data in a corresponding page in the chip E 1051 which is a new storage position corresponding to the logical address X. In addition, for the subsequent read/write request from the host with respect to the logical address X, the memory chip controller 1020 accesses the page corresponding to the logical address X in the chip E 1051.

Through the processes as described above, the switching process from the chip B 1042 to the chip E 1051 is gradually performed. Then, the read/write request from the host with respect to all the logical addresses assigned to the pages in the chip B 1042 is executed through the read/write access to only the chip E 1051, and the chip switching process is completed (6015) at a time T6005.

FIG. 7 is a flowchart showing a process which is performed by the memory chip controller 1020 until the format process or the ECC verification for the chip E 1051. First, the host performs write access to the semiconductor memory system 1000, which causes the memory chip controller 1020 to perform access for write or erasure with respect to the chip B 1042 of the main memory chip (S7010). When the access is performed from the host for erasure, the memory chip controller 1020 increments by "1" the erasure process count register of the block in the chip B 1042 (S7020). Then, when the access result of Step S7010 is an error (S7030), the memory chip controller 1020 reassigns the block in which the error has occurred as the reserved memory block in the chip B 1042 (S7040), and the process proceeds to Step S7050. At this time, the number of the remaining reserved memory blocks in the main memory chip 1040 reduces by 1.

On the other hand, when the result of Step S7030 is not an error, the process proceeds to Step S7070. In Step S7050, the memory chip controller 1020 checks the number of the remaining reserved memory blocks. When the number of the remaining reserved memory blocks is the first predetermined value (e.g., 1), the memory chip controller 1020 starts formatting the chip E 1051 in the sub-memory chip 1050 (S7060), and the process proceeds to Step S7070. In Step S7070, the memory chip controller 1020 checks the value of the erasure process count register of the chip B 1042. When the value is "10000", the memory chip controller 1020 clears the erasure process count register to "0" (S7080), and the process proceeds to Step S7090. On the other hand, when the value of the erasure process count register is not "10000", the memory chip controller 1020 performs no process on the chip E 1051.

In Step S7090, the memory chip controller 1020 checks whether the formatted memory chip (i.e., chip E 1051) is included in the sub-memory chip 1050. When the formatted memory chip is included therein, the memory chip controller 1020 starts the ECC verification process for the stored data in the chip E 1051 (S7100). After that, when detecting an error in the ECC verification process (S7110), the memory chip controller 1020 corrects the error of the stored data by rewriting the data in the chip E 1051 (S7120).

As described above, according to the second embodiment, the memory chip controller 1020 periodically performs verification on the data in the sub-memory chip 1050 according to the progression speed of degradation of the main memory chip 1040 during a period since the completion of the initialization process for the sub-memory chip 1050 until the start of the switching process therefor. As a result, in a case of standby for a long time until the sub-memory chip 1050 starts to be used, fatal data corruption due to a retention failure can be prevented, which makes it possible to enhance the reliability of the semiconductor memory system 1000.

In the above description of the first and second embodiments, when the number of the remaining reserved memory blocks reaches 1, the format process for the sub-memory chip 1050 is started. However, as described above, any number may be set as long as the number indicates the fact that the reprogramming for the main memory chip is inhibited in the near future. Further, triggers for starting the format process or the ECC verification process are not limited to the above-mentioned events. Any event may be adapted as long as the event indicates that the reprogramming for the main memory chip 1040 is inhibited in the near future or indicates that the degradation of the main memory chip 1040 advances to a certain degree. For example, when an event occurs in which all the memory blocks included in the main memory chip 1040 are erased 100000 times on average, the memory chip controller 1020 may start formatting the sub-memory chip 1050. Further, for example, when an event occurs in which the number of the remaining reserved memory blocks reaches 2, the memory chip controller 1020 may start formatting the sub-memory chip 1050. After that, when the number of the remaining reserved memory blocks reaches 1, the memory chip controller 1020 may start performing the ECC verification process for the sub-memory chip 1050.

Further, in the above description, the erasure count of the memory blocks is used for the index of the progression of the degradation. However, the index is not limited thereto. The writing count, the time period from the start of use, or the like can be used for the index of the progression of the degradation.

In addition, after the format process for the chip E 1051, when a mirroring operation is performed between the chip B 1042 and the chip E 1051 like a RAID 1 until the number of the remaining reserved memory blocks in the chip B 1042 reaches 0, it is possible to immediately stop the operation for the chip B 1042 at the time when the reprogramming for the chip B 1042 is inhibited.

Third Embodiment

A third embodiment of this invention will be described below.

The third embodiment is implemented by applying this invention to a semiconductor memory system on which a plurality of small-sized flash memory modules are mounted.

FIG. 8 is a block diagram roughly showing an internal structure of a semiconductor memory system 8000 according to the third embodiment. The semiconductor memory system 8000 includes a host interface 8010, a memory module controller 8020, a write cache memory 8030, a main memory module 8040, and a sub-memory module 8050.

The host interface 8010 is an interface connected to an external host, sends stored read data to the host, and receives write data to be stored from the host in response to a read/write request command from the host. The host designates a storage position of data requested to be read/written using a host logical address. The logical address is different from a module logical address which is used for accessing the main memory module 8040 and the sub-memory module 8050.

A structure of the host interface 8010 and a protocol for transmission/reception of a command or data preferably conform to an interface specification (such as parallel ATA, serial ATA, or SCSI) which provides compatibility with a standard hard disk drive.

The write cache memory 8030 is a volatile memory mainly constituted of a RAM and is used for temporarily storing data as a cache memory. The write data received in response to the write request from the host is temporarily stored in the write cache memory 8030. At this time, the completion of the data write is reported to the host. During a time period for which there is no access from the host, the data is written (destaged) in the main memory module 8040 (or sub-memory module 8050) so as not to cause the write cache memory 8030 to overflow. Further, when read data to be sent in response to a read request from the host is contained in the write cache memory 8030, the data is read from the write cache memory 8030 instead of reading from a predetermined position in the memory module.

The memory module controller 8020 serves as a microprocessor for controlling the host interface 8010, the write cache memory 8030, the main memory module 8040, and the sub-memory module 8050 which are connected thereto. The memory module controller 8020 performs interpretation of the read/write request from the host, transmission/reception of data to/from the host, access to the write cache memory 8030 (read/write), and access to each memory module (read/write), as described above. In addition, the memory module controller 8020 manages the module logical address of the memory module to which the host logical address designated by the host corresponds by using an address conversion table. The memory module controller 8020 includes a non-volatile memory such as an EEPROM or a phase change RAM which has higher reliability than a flash memory, and stores the address conversion table in a part of the memory.

The main memory module 8040 is a memory module group composed of a plurality of flash memory modules (e.g., four modules of module A 8041, module B 8042, module C 8043, and module D 8044). To those modules, host logical addresses are assigned in manufacturing the semiconductor memory system 8000.

The sub-memory module 8050 is a memory module group composed of a plurality of flash memory modules (e.g., two modules of module E 8051 and module F 8052). To those modules, the host logical addresses are not assigned in manufacturing the semiconductor memory system 8000. However, when a part of the main memory module 8040 cannot be reprogrammed due to degradation, the memory module controller 8020 assigns the host logical addresses to the modules.

The memory modules A to F have the same structure and read/write stored data by designating the module logical address by the memory module controller 8020. The structure or the function will be described below by taking the module A 8041 as an example.

The module A 8041 includes an interface 8081 conforming to a universal serial bus (USB), a plurality of (e.g., 3) flash memory chips 8071, 8072, and 8073, and a memory chip controller 8061 for controlling the flash memory chips. Each of the memory chips 8071, 8072, and 8073 has the same structure and characteristics as those of the memory chips (such as chip A 1041) of the first embodiment. The memory chip controller 8061 serves as a microprocessor for controlling the USB interface 8081 and each of the memory chips 8071, 8072, and 8073 connected thereto. The memory chip controller 8061 performs interpretation of the read/write request from the memory module controller 8020, transmission/reception of data to/from the memory module controller 8020, and access to each memory chip (read/write/erasure). In addition, the memory chip controller 8061 has a function of reassigning an error block to a reserved memory block prepared in advance when an error occurs in a write/erasure process for a memory block in use in each memory chip. Further, the memory chip controller 8061 manages the number of remaining reserved memory blocks which is unused in the module A 8041. When the number of the remaining reserved blocks reaches a second predetermined value (e.g., 0), the module A 8041 is inhibited to be reprogrammed.

The memory chip controller 8061 in the module A 8041 has a function of sending to the memory module controller 8020 such a fact that the number of the remaining reserved memory blocks has reached the first predetermined value (e.g., 1) (i.e., reprogramming of the module A 8041 is to be inhibited in the near future) in response to a status read command from the memory module controller 8020, and a fact that the number has reached a second predetermined value (e.g., 0) (i.e., the reprogramming of the module A 8041 is inhibited).

When detecting that the reprogramming of the status read command is to be inhibited in the near future (when the number of the remaining reserved memory blocks reaches the first predetermined value), the memory module controller 8020 starts testing whether one (e.g., module F 8052) of the sub-memory modules is in a state of capable of normally reading/writing data. The test includes the following process as an example. The memory module controller 8020 writes random number data with respect to each module logical address in the module F 8052, and checks whether or not the data read from the address matches the write data. It is preferable to carry out the test little by little when there is no access from the host and when a data amount stored in the write cache memory 8030 is sufficiently small. For example, the test is started for the memory blocks in each memory chip when there is no access form the host. The test is interrupted when there is access from the host. Then, when the access from the host is completed, the test is resumed. Therefore, the test can be intermittently carried out. As a method of carrying out the test, a method which is adopted for a check disk for verifying a storage area of a hard disk drive can also be employed.

A memory block in the sub-memory module 8050 mounted as an alternative to the main memory module 8040 is not accessed for a long time (e.g., 10 years). Therefore, there is a high possibility that data stored in the memory block may be corrupted due to a retention failure of the flash memory cell or the like. For example, in the module F 8052, when fatal data corruption occurs in the memory block in which management information related to control for the memory chip is stored, the module F 8052 may not normally operate as an alternative module.

According to this invention, the memory module controller 8020 checks whether the alternative module F 8052 is normal or abnormal immediately before one of the main memory modules is inhibited to be reprogrammed. When the result thus obtained shows "abnormal", such measures that another module (e.g., module E 8051) in the sub-memory module 8050 is used in place can be taken. Therefore, the reliability of the semiconductor memory system 8000 is enhanced.

Further, the memory chip controller 8061 of the module A 8041 notifies the memory module controller 8020 of the fact that the number of the remaining reserved memory blocks which are unused reaches a second predetermined value. When receiving the notification that the number reaches the second predetermined value, from the memory chip controller 8061 in the module A 8041, according to the access from the host, the memory module controller 8020 switches the storage destination of the read/write data, from the memory module A 8041 in the main memory module 8040 to the module E 8051 in the sub-memory module 8050.

FIG. 9 is a flowchart showing a process performed by the memory module controller 8022 until the test is performed for the chip F 8052. First, the host sends a status read command to the semiconductor memory system 8000 (S9010). When the read status indicates that "reprogramming is to be inhibited soon" (S9020), the memory module controller 8020 starts the test for the module F 8052 in the sub-memory module (S9030).

As described above, in the third embodiment as in the first embodiment, when the number of reserved memory blocks in the modules A to D in the main memory module 8040 reaches the first predetermined value (in the above example, the remaining count of 1), the memory module controller 8020 starts testing the sub-memory module 8050 to be an alternative in the near future. When the storage destination of the data is switched from the main memory module 8040 to the sub-memory module 8050, the sub-memory module 8050 which has already been determined to be normal through the test is used, which reduces a time required for testing the sub-memory module 8050. Therefore, the write data amount to be stored in the write cache memory 8030 during switching the storage destination from the main memory module 8040 to the sub-memory module 8050 can be reduced. As a result, the capacity of the RAM for the write cache memory 8030 to be mounted on the semiconductor memory system 8000 can be reduced, which enables the reduction in the manufacturing cost.

As described above, in the third embodiment, even when the external interface of each memory module in the semiconductor memory system 8000 is not the USB but another standard interface, this invention can be applied, and the effects of this invention can be apparently obtained. In addition, after testing the module F 8052, when a mirroring operation is performed between the module A 8041 and the module F 8052 like a RAID 1 before the module A 8041 is inhibited to be reprogrammed, it is possible to operate the module A 8041 as soon as the module A 8041 is inhibited to be reprogrammed. As a result, the unnecessary module A 8041 is immediately taken out from the system and a new sub-module G is immediately mounted on the position, thereby making it possible to continuously preserve the memory system.

With regard to testing the sub-memory module, a self-testing function is implemented in the memory chip controller in the sub-memory module, and the test for each memory chip is performed autonomously based on the command from the memory module controller 8020, which makes it possible to perform access to the main memory module and a test for the sub-memory module in parallel. Therefore, a more effective operation can be achieved.

While the present invention has been described in detail and pictorially in the accompanying drawings, the present invention is not limited to such detail but covers various obvious modifications and equivalent arrangements, which fall within the purview of the appended claims.

What is claimed is:

1. A semiconductor memory system, comprising:
   a first memory chip including a plurality of non-volatile memory blocks capable of being erased at once;
   a second memory chip including a plurality of non-volatile memory blocks capable of being erased at once; and
   a controller for controlling the first memory chip and the second memory chip,
   wherein the controller includes:
      an in-use memory block assigning unit for assigning a part of the memory blocks in the first memory chip as a memory block in use to/from which read/write is performed;
      a reserved memory block assigning unit for assigning a part of the memory blocks in the first memory chip as a reserved memory block;
      a degradation detecting unit for detecting degradation of the memory block in use in the first memory chip;
      an intra-chip block switching unit for switching the memory block in use in the first memory chip whose degradation has been detected to the reserved memory block in the first memory chip as the memory block in use;
      a remaining reserved memory block count judging unit for detecting a number of the reserved memory blocks unused in the first memory chip and judging whether or not the number of the reserved memory blocks unused has reached a first predetermined value;
      a memory block initializing unit for starting initialization for the memory block in the second memory chip when the number of the reserved memory blocks unused in the first memory chip reaches the first predetermined value;
      a memory chip switch judging unit for judging whether or not the number of the reserved memory blocks unused in the first memory chip has reached a second predetermined value; and
      a memory chip switching unit for assigning the memory block in the second memory chip which has been initialized as the memory block in use in place of the first memory chip when the number of the reserved memory blocks unused in the first memory chip reaches the second predetermined value, and
   wherein the first predetermined value is set, based on progression speed of the degradation of the first memory chip and speed at which the memory block initializing unit performs the initialization, to such a value that the initialization for the memory block in the second memory chip is completed during a time period between when the memory block initializing unit starts the initialization and when the number of the reserved memory blocks unused in the first memory chip reaches the second predetermined value.

2. The semiconductor memory system according to claim 1, wherein the progression speed of the degradation corresponds to a number of the reserved memory blocks unused which are assigned as the memory blocks in use in a unit time.

3. The semiconductor memory system according to claim 1, wherein the controller performs a verification process of judging whether or not data stored in the memory block in the second memory chip which has been initialized is valid during a time period between when the initialization is completed and when the number of the reserved memory blocks unused in the first memory chip reaches the second predetermined value.

4. The semiconductor memory system according to claim 3, wherein the controller repeatedly performs the verification process at a predetermined interval.

5. The semiconductor memory system according to claim 4, wherein the controller repeatedly performs the verification process each time a number of erasure processes for the memory block in the first memory chip reaches a third predetermined value, and resumes counting the number of the erasure processes after resetting the number of the erasure processes.

6. A semiconductor memory system, comprising:
a first memory module including a memory chip having a plurality of non-volatile memory blocks capable of being erased at once;
a first chip controller for controlling the memory chip in the first memory module;
a second memory module including a memory chip having a plurality of non-volatile memory blocks capable of being erased at once;
a second chip controller for controlling the memory chip in the second memory module; and
a memory module controller for communicating with the first chip controller and the second chip controller to control the first memory module and the second memory module,
wherein the first chip controller includes:
an in-use memory block assigning unit for assigning a part of the memory blocks in the memory chip constituting the first memory module as a memory block in use to/from which read/write is performed;
a reserved memory block assigning unit for assigning a part of the memory blocks in the memory chip constituting the first memory module as a reserved memory block;
a degradation detecting unit for detecting degradation of the memory block in use in the first memory module;
an intra-module block switching unit for assigning the reserved memory block in the first memory module as the memory block in use in place of the memory block in use in the first memory module whose degradation has been detected;
a remaining reserved memory block count judging unit for detecting a number of the reserved memory blocks unused in the first memory module and judging whether or not the number of the reserved memory blocks unused has reached a first predetermined value; and
a first notifying unit for notifying the memory module controller of a fact that the number of the reserved memory blocks unused in the first memory module has reached the first predetermined value, and
wherein the memory module controller includes a test command unit for commanding the second chip controller in the second memory module to perform testing the memory chip, when receiving from the first notifying unit the notification that the number of the reserved memory blocks unused has reached the first predetermined value.

7. The semiconductor memory system according to claim 6, wherein the second chip controller includes a testing unit for verifying whether or not the memory chip performs a normal operation when receiving the command of the testing from the memory module controller.

8. The semiconductor memory system according to claim 6,
wherein the first chip controller further includes a second notifying unit for notifying the memory module controller of a fact that the number of the reserved memory blocks unused in the first memory module has reached a second predetermined value, and
wherein the memory module controller further includes a memory module switching unit for assigning the second memory module as a storage destination of data to/from which read/write is performed in place of the first memory module, when receiving from the first memory module the notification that the number of the reserved memory blocks unused has reached the second predetermined value.

9. The semiconductor memory system according to claim 1, further comprising a cache memory for temporarily storing data to be written in one of the first memory chip and the second memory chip,
wherein the controller controls the first memory chip, the second memory chip, and the cache memory.

10. The semiconductor memory system according to claim 6, further comprising a cache memory for temporarily storing data to be written in one of the first memory module and the second memory module,
wherein the memory module controller communicates with the first chip controller and the second chip controller to control the first memory module, the second memory module, and the cache memory.

* * * * *